United States Patent
Phillips et al.

(10) Patent No.: US 6,350,312 B1
(45) Date of Patent: Feb. 26, 2002

(54) STRONTIUM DOPING OF MOLTEN SILICON FOR USE IN CRYSTAL GROWING PROCESS

(75) Inventors: Richard Joseph Phillips, St. Peters; Steven Jack Keltner, O'Fallon; John Davis Holder, Lake St. Louis, all of MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/521,525

(22) Filed: Mar. 8, 2000

Related U.S. Application Data (60) Provisional application No. 60/124,400, filed on Mar. 15, 1999.

(51) Int. Cl.[7] .............................................. C30B 15/10
(52) U.S. Cl. ............................ 117/13; 117/14; 117/30; 117/35; 117/200; 117/208; 117/932
(58) Field of Search .............................. 117/13, 14, 200, 117/932, 208, 35, 30

(56) References Cited

U.S. PATENT DOCUMENTS

| | | | |
|---|---|---|---|
| 2,872,299 A | 2/1959 | Celmer et al. ................ | 23/301 |
| 5,976,247 A | 11/1999 | Hansen | |
| 5,980,629 A | 11/1999 | Hansen | |

FOREIGN PATENT DOCUMENTS

| | | |
|---|---|---|
| EP | 0691423 A1 | 1/1996 |
| EP | 0753605 A1 | 6/1996 |
| EP | 0748885 A1 | 12/1996 |
| EP | 80748885 | 12/1996 |
| EP | 90753605 | 1/1997 |
| JP | 089002932 | 1/1996 |
| JP | 38169798 | 7/1996 |
| JP | 48217592 | 8/1996 |
| JP | 58239231 | 9/1996 |
| JP | 68333124 | 12/1996 |
| JP | 11021196 | 1/1999 |
| JP | 71121196 | 1/1999 |

OTHER PUBLICATIONS

Liu et al., "Reaction Between Liquid Silicon and Vitreous Silica", J.Mater.Res., 7(2), p. 352 (1999).
PCT/US00/06565, International Search Report.
PCT/US00/06750, International Search Report.

*Primary Examiner*—Robert Kunemund (57) ABSTRACT

A process for preparing strontium doped molten silicon for use in a single silicon crystal growing process is disclosed. Polysilicon is doped strontium and melted in a silica crucible. During melting and throughout the crystal growing process the strontium acts as a devitrification promoter and creates a layer of devitrified silica on the inside crucible surface in contact with the melt resulting in a lower level of contaminants in the melt and grown crystal.

37 Claims, 3 Drawing Sheets

STRONTIUM DOPING OF MOLTEN SILICON FOR USE IN CRYSTAL GROWING PROCESS

This application claims priority from U.S. Provisional Pat. Application No. 60/124,400 filed on Mar. 15, 1999.

BACKGROUND OF THE INVENTION

The present invention relates to a process for doping molten silicon for use in a crystal growing process. More particularly, the present invention relates to a process for doping molten silicon with strontium for use within a silica crucible to cause the formation of a thin devitrified layer of silica to form on the inside crucible walls during melting of the polysilicon and throughout the ingot growing process without significant strontium incorporation in the growing ingot.

In the production of single silicon crystals grown by the Czochralski method, polycrystalline silicon is first melted within a quartz crucible. After the polycrystalline silicon has melted and the temperature equilibrated, a seed crystal is dipped into the melt and subsequently extracted to form a single crystal silicon ingot while the quartz crucible is rotated. Due to the extremely high temperatures achieved during ingot growth, the quartz crucible walls are slowly dissolved at the crucible-melt interface as the ingot is grown. One disadvantage associated with the use of vitreous silica crucibles is the fact that contaminants on the inner surface of the crucible can nucleate and promote the formation of cristobalite islands in the vitreous silica surface (the islands being centered, in general, about the contamination site) as the polysilicon is melted and the single crystal ingot is grown. The cristobalite islands can be undercut during melting and released as particles into the silicon melt, causing the formation of dislocations in the silicon ingot. The cristobalite islands can be undercut, for example, by the action of a low melting eutectic liquid formed at the interface between the vitreous silica and cristobalite as described by Liu et al., "Reaction Between Liquid Silicon and Vitreous Silica," *J Mater. Res.,* 7(2), p. 352 (1992).

To reduce the amount of contaminants released into the melt, silica crucibles used in crystal growth generally have two distinct zones. The outer zone of the crucible in contact with the graphite mechanism supporting the crucible contains a high density of bubbles to regulate radiant heat transfer to the melt and crystal. The inner zone contains a reduced bubble layer commonly referred to as a clear layer or bubble free layer. This inner layer is not totally bubble free and upon exposure to temperatures typical to crystal growth dissolved or trapped gas near the crucible surface can form bubbles on the crucible surface and be released into the silicon melt. The release of bubbles over an extended period of time can cause degradation of the inner layer of the crucible and voids in the growing ingot. This degradation is a time limiting factor for crystal growth and can result in a loss of zero dislocation structure or physical defects such as large light point defects in the grown crystal.

Various approaches are known in the art for reducing contaminant production by improving the durability of the inner layer of the crucible through either stabilizing the silica/silicon interface or increasing bubble stability within the crucible surface. Some of the approaches include improving the stability by controlling hydroxide content of the inner layer below a certain value (Matsumura Japanese Patent Application 08-169798), forming a bi-layer structure by fusing a preformed silica tube (the inner layer) into a backing layer (bubble composite) (Watanabe et al. Japanese Patent Application 08-333124), and annealing the crucible in a hydrogen atmosphere at elevated pressure to incorporate hydrogen into the silica such that upon exposure to the melt and the subsequent dissolution of the silica, hydrogen is incorporated into the silicon crystal to reduce stacking faults.

Additionally, others have attempted to reduce or eliminate contaminant production by the crucible into the melt and/or crystal by improving the durability of the silica through the use of a devitrification promoter coating pre-applied to the crucible surface prior to the introduction and heating of polysilicon (Hansen et al. EP 0748885A1, EP 0753605A1.) Upon the melting of the polysilicon, these coatings cause a devitrified silica surface to form in the presence of the silicon melt throughout the crystal pulling process.

Although several attempts have been made to improve crucible performance and reduce contamination of the melt during the ingot growing process, none of the attempts to date have been completely successful in eliminating all contaminant production by the crucible. As such, a need still remains in the art for an improved crucible capable of producing ingots with reduced contaminant and defect levels.

SUMMARY OF THE INVENTION

Among the objects of the present invention, therefore, are the provision of producing an improved silicon melt for ingot growth; the provision of producing a crucible having a controlled devitrification layer thickness based on silicon melt doping level; the provision of providing a continuous thin film of devitrified silica on a crucible surface for different dopant levels without the formation of transverse fractures at the devitrified interface; and the provision of a process for preparing a silicon/strontium alloy.

Briefly, therefore, the present invention is directed to a process for preparing a silicon melt in a silica crucible for growing a single silicon ingot. The process comprises first charging polysilicon to a crucible having a bottom wall and a sidewall formation and melting the polysilicon to form a mass of molten silicon in the crucible. The molten mass is then doped with strontium and a layer of devitrified silica is formed on the inside surface of the sidewall formation of the crucible in contact with the molten mass.

The invention is further directed to a process for preparing a silicon melt in a silica crucible for growing a single silicon ingot. The process comprises first charging polysilicon to a crucible having a bottom and a sidewall formation and melting the polysilicon to form a mass of molten silicon in the crucible. The molten mass is then doped with strontium and a layer of devitrified silica is formed on an inside surface of the sidewall formation of the crucible in contact with the molten mass. Finally, additional dopant is charged to the molten mass after the inside surface of the sidewall formation of the crucible is partially devitrified.

The invention is further directed to a process for preparing a silicon melt in a silica crucible for growing a single silicon ingot. The process comprises first charging polysilicon to a crucible having a bottom wall and a sidewall formation and melting the polysilicon to form a mass of molten silicon in the crucible. The molten mass is then doped with strontium and a layer of devitrified silica is formed on the inside surface of the crucible in contact with the molten mass.

The invention is still further directed to a process for preparing a silicon melt in a silica crucible for growing a single silicon ingot. The process comprises first charging polysilicon and strontium to a crucible having a bottom wall and a sidewall formation and melting the polysilicon to form a mass of molten silicon in the crucible. A layer of devitrified silica is formed on the inside surface of the sidewall formation of the crucible in contact with the molten mass.

BRIEF DESCRIPTION OF THE DRAWINGS

Corresponding reference characters indicate corresponding parts throughout the drawings.

DETAILED DESCRIPTION OF THE PREFERRED EMBODIMENTS

In accordance with the present invention, it has been discovered that the amount of contaminants released into a silicon melt from a crucible during a crystal growing process can be reduced by doping the silicon melt with strontium, or a strontium containing composition, which is capable of causing devitrification on the silica crucible surface. Surprisingly, it has been discovered that the crucible surfaces can be selectively devitrified and the formation of the devitrified layer on the silica surface can be controlled such that it will not significantly crack and/or release particulates into the molten silicon during ingot growth. The reaction path for the formation of the devitrified layer avoids porosity and island undercutting from decomposition products that can become trapped in the devitrified layer. Furthermore, the formation of the devitrified layer relative to the various stages involved in crystal growth can be controlled such that at critical points during ingot growth the surface will allow for release of insoluble gases from the bottom and sidewalls of the crucible resulting in fewer crystal voids and reduced particulate generation.

Figure 2:
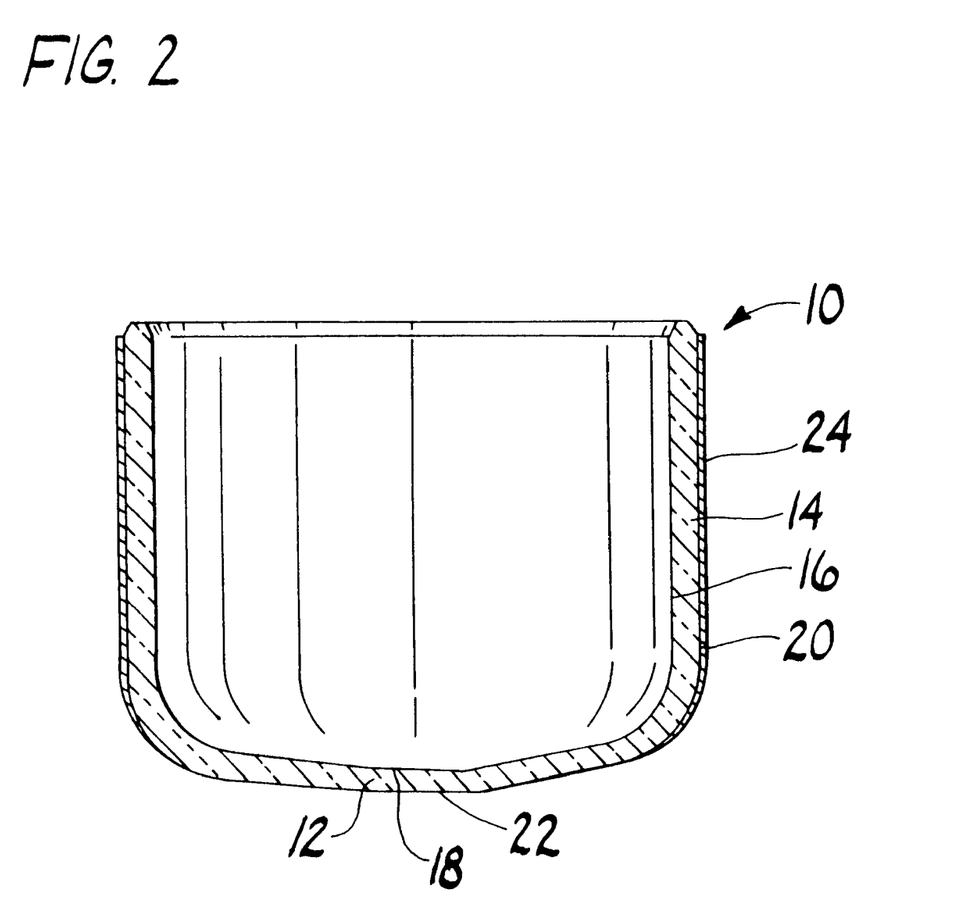
FIG. 2 is a diagram of a quartz crucible.

Turning now to FIG. 2, there is shown a conventional quartz crucible 10 which is used in accordance with the present invention. The crucible 10 has a bottom wall 12 and a sidewall formation 14 extending up from the bottom wall 12 and defining a cavity for holding molten semiconductor material. The sidewall formation 14 and bottom wall 12 have respective inner surfaces 16, 18, and outer surfaces 20, 22. During the melting of the polysilicon of the present invention and throughout the ingot growth process within a silica crucible, the strontium contained in the silicon melt interacts with the silica crucible and provides nucleation sites at the crucible surface where stable crystal seed nuclei form and cause the vitreous silica at the crucible surface to crystallize and form a substantially uniform and continuous devitrified shell of cristobalite on the surface of the crucible. Strontium can be added to the silicon melt as elemental strontium or as a strontium containing composition. A substantially uniform and continuous devitrified shell forms on the inside surface of the crucible up to the melt line and is continuously regenerated as the melt dissolves the shell throughout the ingot growing process. The substantially uniform and continuous devitrified shell formed on the inner surface of the crucible dissolves substantially uniformly when in contact with the silicon melt. Dislocations formed in a growing crystal are thus minimized as a substantial amount of particulates are not released into the melt by the devitrified shell.

The continuous layer of devitrified silica formed due to the interaction of strontium with the silica surface is not immediately formed upon the heating and melting of the doped polysilcion. After the strontium dopant and polysilicon are charged to the crucible and melting begins, the strontium first causes devitrification of the sidewalls of the crucible. If sufficient strontium is present in the silicon melt, the strontium will also cause devitrification of the bottom of the crucible. Because devitrification of the crucible is not instantaneous upon the heating of the polysilicon and strontium dopant, gases such as argon which are insoluble in silicon contained in the crucible matrix can escape from the crucible surface and leave the melt prior to incorporation into the growing ingot as void defects. After the strontium doped silicon is charged to a silica crucible and melted causing a devitrified layer to form on the bottom and/or sidewalls of the crucible, a single silicon crystal is grown. Several methods of growing crystals are well known in the art, such as that described in U.S. Pat. Nos. 3,953,281 and 5,443,034.

Strontium or strontium containing compositions are used as dopants in accordance with the present invention in the silicon melt to promote devitrification of the silica surface during polysilicon melting and during the growing of the single silicon ingot. Suitable strontium compositions that can be used as dopants include, for example, oxides, carbonates, silicates, acetates, silicides, hydrides, chlorides, hydroxides, and oxalates. Strontium can be in the form of an element, an ion, or as an ion pair with an organic ion. Preferred compositions include strontium nitrate and strontium chloride. More preferred compositions include strontium oxalate, strontium acetate, and strontium hydroxide. The most preferred compositions are strontium carbonate and strontium oxide. Strontium or strontium containing compositions are used as dopants such that a substantial amount of strontium is not incorporated into the body of the growing crystal. It is preferred that no more than about 5 ppbw, more preferably no more than about 3 ppbw, and still more preferably no more than about 2 ppbw of strontium be incorporated into the body of the growing crystal.

In one embodiment of the present invention, the introduction of a strontium dopant into the silicon melt to prepare the strontium doped silicon melt in a crucible is facilitated by adding a strontium dopant alloyed with polysilicon in solid form to a silica crucible. As used herein, the term "alloy" or "alloyed" refers to a substance composed of two or more metals (an "intermetallic" compound), one metal with a metal compound, or two metal compounds. Strontium/silicon is an example of an alloy for use in the present invention. At lower concentrations of strontium in the strontium/silicon alloy the strontium is substantially dissolved into the silicon matrix and substantially no direct chemical reaction between the strontium and silicon occurs. As the amount of strontium in the strontium/silicon alloy increases, the dissolution limit of strontium in silicon is reached and strontium/silicon chemical compounds such as $SrSi_2$ and $SrSi$ are formed in the alloy. Thus at higher concentrations the strontium/silicon alloy may be comprised of two components; dissolved strontium in silicon and strontium/silicon chemical compounds such as $SrSi_2$ and $SrSi$.

Alloys for use in the present invention may be prepared using, for example, an induction melting furnace. Granular, chunk, or a mixture of granular and chunk polysilicon is first loaded into and melted within the furnace at a suitable temperature. Once the temperature of the molten silicon equilibrates a suitable amount of strontium dopant is added to the molten silicon. The silicon/strontium dopant mixture is throughly agitated and mixed. Finally, the heat is removed and the mixture is allowed to solidify to create a strontium doped polysilicon alloy in accordance with the present invention for use in growing a single crystal silicon ingot. It will be recognized by one skilled in the art that the alloyed polysilicon could be charged directly into a silica crucible for melting, or could be mixed with some amount of virgin polysilicon to properly adjust the amount of strontium dopant entering the melt to control devitrification of the silica surface.

In an alternative embodiment, the preparation of the strontium doped molten silicon of the present invention can be accomplished through the addition of strontium directly into a crucible containing molten silicon. In this embodiment chunk, granular, or a mixture of chunk and granular polysilicon is first melted within a crucible located in the crystal growing apparatus. After the temperature of the melted silicon in the crucible has equilibrated, strontium is added directly into the melted silicon and the ingot growing process initiated. Alternatively, polysilicon and strontium can be added simultaneously and then heat applied to melt the polysilicon and create a strontium doped molten mass. These embodiments cause the devitrified layer of silica on the crucible to form later in the crystal growing process than the alloy-type doping described above. For the same doping level, alloy-type doping results in faster devitrification of the silica surface as the dopant is present throughout the silicon melting process allowing devitrification to begin earlier. Doping after the silicon is melted results in slower devitrification of the silica as the kinetics of the reaction are slower as it takes more time for the dopant to be mixed with the polysilicon and reach the silica surface.

The amount of strontium or strontium containing composition to be alloyed with polysilicon and the polysilicon melted or added directly to molten silicon in the crystal growing apparatus prior to ingot growth should be such that a thin, continuous layer of devitrified silica forms on the crucible wall in contact with the doped molten silicon. A thin, continuous layer of devitrified silica allows stresses in the layer to be equally distributed throughout the entire layer resulting in a substantially crack-free surface. This continuous layer allows for void release from the crucible surface due to the kinetic rate of formation during the crystal growth, and thus reduces the incorporation of void defects into the growing ingot. The amount of strontium dopant in the molten silicon necessary to produce a thin, continuous, crack-free surface will vary depending upon the size of the crucible. The present invention is useful in creating a devitrified layer with all crucible sizes, including but not limited to 14 inch to 32 inch crucibles. Also, single or double chambered crucibles are within the scope to the present invention.

By controlling the amount of strontium or strontium containing composition introduced into the silicon melt, the crucible bottom and sidewalls can be selectively devitrified during the silicon melting and crystal growing. Although other devitrification promoters such as barium first devitrify the bottom of the crucible upon addition to the melt, when a silicon melt is doped with strontium or a strontium containing composition, the strontium first causes devitrification of the sidewalls of the crucible. Strontium first devitrifies the sidewalls of the crucible up to the melt line followed by the bottom of the crucible if sufficient strontium is located in the silicon melt. At lower concentrations of strontium in the silicon melt, only the sidewalls of the crucible up to the melt line will devitrify. At low concentrations of strontium in the melt the bottom of the crucible will remain vitreous and continue to allow bubble release from the bottom of the crucible. These bubbles can be partially or completely comprised of gases insoluble in silicon. As such, it may be advantageous to allow the escape of these bubbles from the melt such that a crystal having lower concentration of void defects can be grown. Bubble release from the bottom of the crucible is significantly more problematic as compared to bubble release from the sidewalls of the crucible. Bubbles released from the bottom portion of the crucible tend to get caught in the vortex created by the rotating crystal and generally take a much greater amount of time to release into and eventually out of the melt. Bubbles produced from the sidewalls of the crucible are not generally caught in the silicon melt vortex and are capable of entering the melt and exiting into the crystal growth atmosphere much more quickly than bubbles produced from the bottom of the crucible.

As the concentration of strontium in the silicon melt increases both the sidewalls up to the melt line and the bottom of the crucible are devitrified. In one embodiment of the present invention the strontium dopant can be introduced into the crucible in two or more separate steps during melting to selectively devitrify the sidewalls of the crucible early in the melting process and the bottom of the crucible later in the melting process. This embodiment allows devitrification of the sidewalls early in the process to reduce particulate contamination of the melt while allowing gases contained in the crucible bottom a longer period to escape from the melt. Later in the melting process, additional strontium can be added to devitrify the bottom of the crucible and reduce particulate contamination during crystal pulling. The amount of strontium necessary to achieve selective devitrification is a function of the pulling process utilized and the construction and configuration of the hot zone. Hot zones are generally characterized as either "conventional" hot zones or "advanced" hot zones. Conventional hot zones have typically been utilized at temperatures of between about 50 and about 150° C. hotter than advanced hot zones. Advanced hot zones are generally better insulated and use purge tubes such that the temperatures need not be as high as conventional hot zones.

The amount of strontium to be added to the melt to create devitrification on the bottom and/or the sidewalls of the crucible is determined based upon the volume of the silicon charge, wetted area of the crucible surface and the type of hot zone utilized. As shown in equation (1), to devitrify both the bottom and sidewalls of the crucible up to the melt line, the amount of strontium divided by the volume of the polysilicon charge divided by the wetted area of the crucible is at least about $1.5 \times 10^{-12}$ $g/cm^3/cm^2$, more preferably at least about $1.5 \times 10^{-11}$ $g/cm^3/cm^2$, and most preferably at least about $1.5 \times 10^{-10}$ $g/cm^3/cm^2$ for conventional type hot zones and at least about $6 \times 10^{-11}$ $g/cm^3/cm^2$, more preferably at least about $6 \times 10^{-10}$ $g/cm^3/cm^2$, and most preferably at least about $6 \times 10^{-9}$ $g/cm^3/cm^2$ for advanced hot zones.

Strontium(g)Volume of Si Charge($cm^3$)/wetted area of silica ($cm^2$)  (1)

To devitrify only the sidewalls of the crucible up to the melt line but not the bottom of the crucible such that gases can escape from the bottom during the crystal pulling and/or melting process, a lower amount of strontium is added to the silicon melt. If a conventional type hot zone is utilized, about $3.5 \times 10^{-13}$ $g/cm^3/cm^2$, more preferably about $3.5 \times 10^{-12}$ $g/cm^3/cm^2$, and most preferably about $3.5 \times 10^{-11}$ $g/cm^3/cm^2$ is added to the silicon melt to devitrify the sidewalls of the crucible. If an advanced hot zone is utilized, about $2 \times 10^{-11}$ $g/cm^3/cm^2$, more preferably about $2 \times 10^{-10}$ $g/cm^3/cm^2$, and most preferably about $2\times10^{-9}$ g/cm$^3$/cm$^2$ is added to the silicon melt to devitrify the sidewalls of the crucible.

It will be recognized by one skilled in the art that a controlled devitrification layer thickness can be readily achieved by varying the amount of strontium added. Variables such as charge composition, pulling technique and apparatus, and pulling time may require that a thicker or thinner devitrified layer be used to achieve the benefits of the present invention.

In an alternative embodiment, the strontium doped molten silicon of the present invention can be charged to a crucible having a devitrification promoter on the outer surface. Referring again to FIG. 2, the devitrification promoter 24 is on the outside surface 20 of the sidewall formation 14. The outer surface of the crucible is prepared prior to the charging the strontium doped polysilicon of the present invention by placing a coating on the outer surface of the crucible by drip coating or spraying, for example, which forms a layer having a high density of nucleation sites on the outer surface. When the crucible is heated to melt the doped polysilicon and grow a silicon ingot, the devitrification promoter reacts with the vitreous silica to form crystalline nuclei on the outer surface of the crucible. As the melting process continues, the silicon melt and the graphite susceptor act as a reducing agent and promote the rapid growth of these crystalline nuclei at the surface in a radial direction from the nucleation sites. In the presence of the strontium doped silicon melt and the graphite susceptor, these crystalline nuclei grow to confluence, that is, a continuous ceramic shell is formed on the crucible increasing the mechanical strength of the crucible and reducing its reactivity with the graphite supports.

Devitrification promoters suitable for coating the exterior surface of the crucible include alkaline-earth metal oxides, carbonates, hydroxides, oxalates, silicates, fluorides, chlorides, and peroxides, boron trioxide, and phosphorus pentoxide. Other devitrification promoters, such as titanium dioxide, zirconium dioxide, ferric oxide, ion pairs of an alkaline-earth metal cation and an organic anion including alkaline-earth metal formates, acetates, propionates, salicylates, stearates and tartrates, and promoters containing transition metals, refractory metals, lanthanides or actinides, although less preferred, can also be used to coat the outer surface.

The devitrification promoter is preferably an alkaline-earth metal selected from the group consisting of calcium, barium, magnesium, strontium and beryllium. The alkaline-earth metal can be in any form which adheres to the crucible surfaces. The alkaline-earth metal can be in the form of the element (e.g. Ba), a free ion (e.g. Ba$^{2+}$), or an ion pair with an organic anion such as an oxide, hydroxide, peroxide, carbonate, silicate, oxalate, formate, acetate, propionate, salicylate, stearate, tartrate, fluorine, or chlorine. Preferably, the devitrification promoter is an oxide, hydroxide, carbonate or silicate of an alkaline-earth metal.

The exterior coating must contain sufficient devitrification promoter to nucleate a layer of substantially devitrified silica. A concentration of at least about 0.10 mM of alkaline-earth metal per thousand square centimeters generally provides a uniform coating capable of promoting devitrification. An externally coated crucible preferably has an alkaline-earth metal concentration ranging from about 0.10 mM/1000 cm$^2$ to about 1.2 mM/1000 cm$^2$ and, more preferably ranges from about 0.30 mM/1000 cm$^2$ to about 0.60 mM/1000 cm$^2$. The outer crucible surface can be coated by any method which deposits the devitrification promoter onto the surface, such as drip coating or spray coating processes.

In an alternative embodiment the strontium doped molten silicon of the present invention can be utilized in combination with a crucible containing very low amounts of gases which are insoluble in silicon (See U.S. Pat. No. 5,913,975 incorporated herein by reference.) Such a crucible helps reduce defects caused by insoluble gases, such as argon, which can escape from the crucible during ingot growth.

This crucible containing very low levels of gases insoluble in silicon is prepared by fusing the crucible in an atmosphere with a reduced amount of insoluble gases such as argon. By fusing the crucible in this type of atmosphere, the bubbles which form in the crucible matrix have a reduced content of insoluble gases such as argon. Thus, when the bubbles are released into the melt as the crucible dissolves during crystal growth, insoluble gas-causing crystal void defects in the crystal are minimized or eliminated.

The gas atmosphere surrounding the apparatus for fusing the crucible contains less than about 0.5%, more preferably less than about 0.1%, and most preferably less than about 0.01% of gases insoluble in silicon. As used herein, the term "insoluble in silicon" means that the gas is virtually non-reactive with liquid silicon and is capable of surviving in liquid silicon without significant dissolution. Suitable atmospheres may include synthetic air, a mixture of nitrogen and oxygen, or pure nitrogen.

In an alternative embodiment the strontium doped molten silicon of the present invention can be used in combination with a crucible having one or more tungsten doped layers. The layers behave similar to, and may be, bubble free. When the strontium doped molten silicon of the present invention is used in combination with a tungsten doped layer on the inside surface, the devitrified layer along with the reduced bubble layer decrease the amount of contaminants in the melt. A tungsten doped layer on the outside crucible surface may strengthen the crucible and reduce its reactivity. Surprisingly, the tungsten dopant in the quartz matrix causes bubbles in the treated surface of the quartz crucible to collapse and not re-form during subsequent thermal use without the out-diffusing of tungsten from the crucible surface or the contamination of the growing ingot which can result in the loss of zero dislocation growth and/or a reduction of crystal quality.

Figure 1:
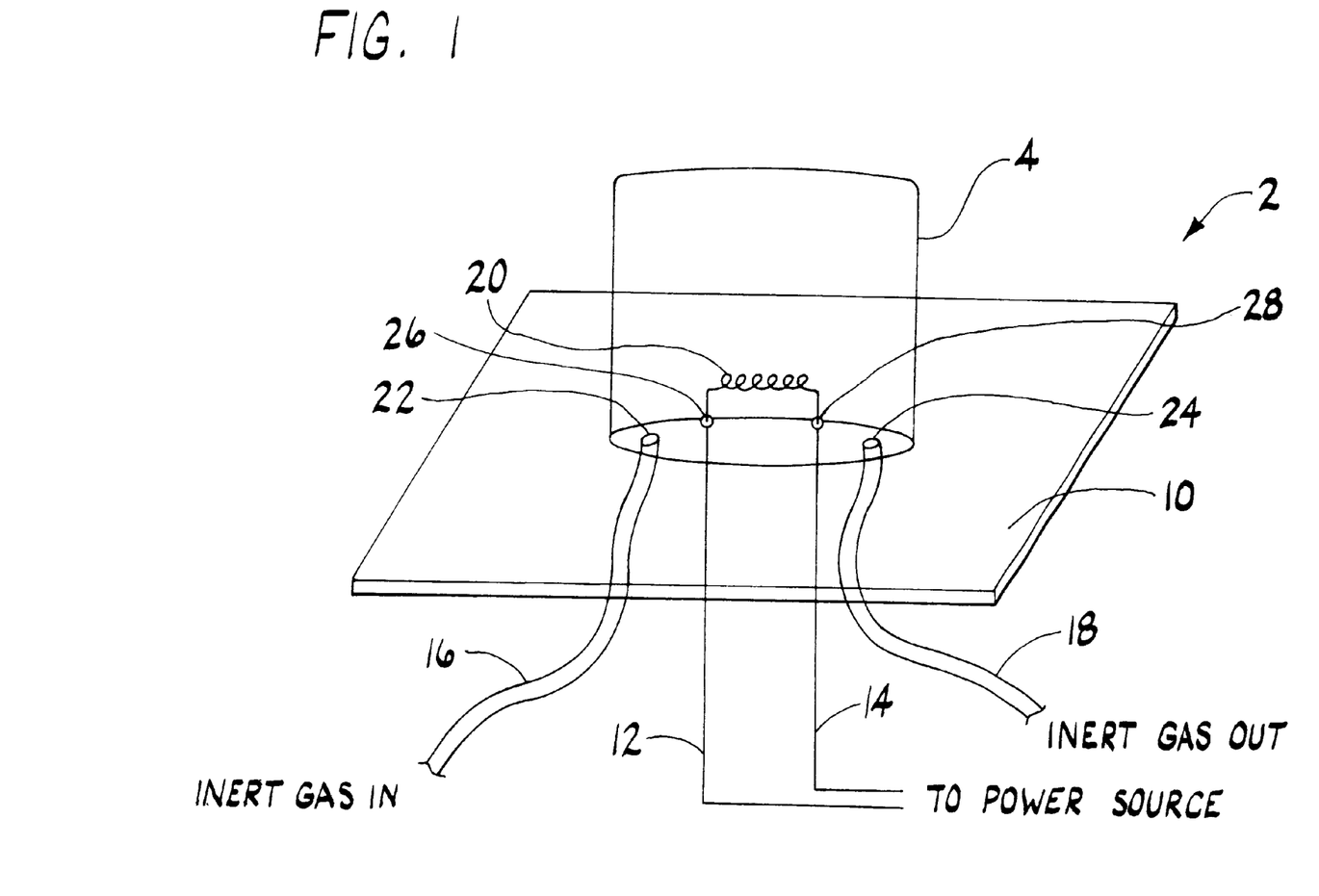
FIG. 1 is a diagram of an apparatus for annealing a tungsten dopant into the inside surface of a crucible.

Referring now to FIG. 1, there is shown an apparatus 2 for annealing a tungsten dopant into the inside surface of a crucible 4 in accordance with the present invention. Referring again to FIG. 1, the apparatus 2 comprises a horizontal support table 10, electrical leads 12 and 14 connected to a power source (not shown), inert gas inlet line 16 connected to an inert gas source (not shown), inert gas outlet line 18, and tungsten source 20. The inert gas moves oxygen away from the tungsten source to reduce unwanted oxidation of the source and the formation of solid oxides. Suitable inert gases may include, for example, argon, helium, xenon and the like. Horizontal support table 10 supports the crucible being treated, and may be comprised of stainless steel, glass, or ceramic for example. Table 10 has holes 22 and 24 drilled into its surface to allow inert gas inlet line 16 and inert gas outlet line 18 access to the environment surrounding the crucible being treated. Also, table 10 has holes 26 and 28 drilled into its surface to allow electrical lines 12 and 14 access to tungsten source 20.

A tungsten vapor is created within the interior of the crucible when electrical leads 12 and 14 are energized to heat tungsten source 20. Prior to the heating of the tungsten source 20 and the production of tungsten vapor, inert gas is introduced into the environment surrounding tungsten source 20 through inert gas inlet line 16. Inert gas is continuously introduced into the environment surrounding tungsten source 20 throughout the heating of the source and the production of tungsten vapor. Inert gas is removed from the environment surrounding the tungsten source through inert gas outlet line 18. This continuous purging of the environment surrounding tungsten source 20 removes substantially all of the oxygen from the environment surrounding tungsten source 20. The flow of the purging gas should be such that it is sufficient to remove substantially all of the oxygen such that the formation of solid oxides is substantially eliminated. It should be noted that one skilled in the art would recognize that a small amount of sealant, such as vacuum grease, silicon or another suitable sealant could be utilized between the crucible and the support table to ensure that the amount of oxygen entering the environment surrounding the tungsten source is reduced. Also, a reduced pressure in place of or in combination with inert gas may be used to reduce the oxygen concentration in the area of the tungsten source.

The vaporous tungsten produced by the heated tungsten source in the substantially oxygen free environment diffuses into the inside surface of the crucible. The tungsten source is heated to an increased temperature which in turn increases the temperature on the inside surface to facilitate diffusion. The inside surface of the crucible is generally exposed to the vaporous tungsten for a period of between about 1 hour and about 10 hours, more preferably between about 2 hours and about 8 hours, still more preferably between about 4 hours and about 6 hours, and most preferably about 5 hours to create a tungsten doped layer containing no less than about 100 ppba (parts per billion atomic) tungsten, preferably no less than about 200 ppba tungsten, and most preferably no less than about 300 ppba tungsten on the inside surface of the crucible. The tungsten is diffused between about 0.1 millimeter and about 4 millimeters into the inside surface to create a tungsten doped layer on that surface having a depth equal to the depth of the diffused tungsten. Tungsten can be diffused into crucibles of all sizes to improve performance. It would be recognized by one skilled in the art that tungsten could be annealed deeper into the inside surface by annealing for a longer time period should the commercial need arise. Upon use in a crystal growing process, the tungsten doped layer behaves like, and may be, a bubble free layer.

One skilled in the art will also recognize that the annealed tungsten will not create a sharp transition from, for example 100 ppba to 0 ppba within the crucible. A gradient is created as the tungsten is annealed into the surface, and although a tungsten doped layer is created having a thickness of, for example, 4 millimeters, some tungsten diffuses beyond the 4 millimeter range into the crucible.

As used herein the term bubble free layer can mean that the layer is completely bubble free, or that it is substantially free from bubbles. Current analytical detection methods for identifying bubbles in quartz crucibles are capable of detecting bubbles having a diameter of about 15 micrometers for a large field of view on the order of a few millimeters. When tungsten is annealed into the inside surface of a crucible in accordance with the present invention to a depth of between about 0.1 millimeter and about 4 millimeters, the area containing the tungsten has 0 bubbles per cubic millimeter having a diameter at least about 15 micrometers. Similarly, after thermal cycling typical of the ingot growing process the crucible contains 0 bubbles per cubic millimeter having a diameter at least about 15 micrometers. It would be recognized by one skilled in the art that as analytical detection methods improve and bubbles having a smaller diameter can be identified, it would be preferred that the amount of tungsten annealed into the crucible surface be adjusted accordingly to achieve a level of no detectable bubbles in the tungsten doped region as discussed above.

When the crucible having the tungsten doped layer is subsequently utilized in a crystal pulling process, the crucible is slowly dissolved into the silicon melt due to the extreme conditions necessary for ingot growth. As such, the tungsten located in the quartz matrix that is dissolved into the melt enters the silicon melt. However, it has been shown that the tungsten does not enter into the growing ingot in detectable amounts. The reasons for this appear two-fold. First, because such a low amount of tungsten is required to be annealed into the crucible to achieve the desired effect, a substantial amount of tungsten is not present in the melt. Secondly, because tungsten has a low segregation coefficient, it tends to stay in the liquid silicon and not become crystalized into the growing ingot.

In an alternative embodiment of the present invention, tungsten can be annealed into the inside and/or the outside surfaces of a quartz crucible to create tungsten doped layers on both the inside and outside surfaces. The annealing of tungsten into the outside surface of a crucible to create a tungsten doped layer may increase the mechanical strength of the crucible to reduce deformation of the crucible during ingot growth. Additionally, a tungsten doped layer on the outside surface reduces the reactivity of the crucible with the graphite support structure supporting the crucible and therefore decreases the amount of contaminates surrounding the growing ingot and silicon melt.

Figure 3:
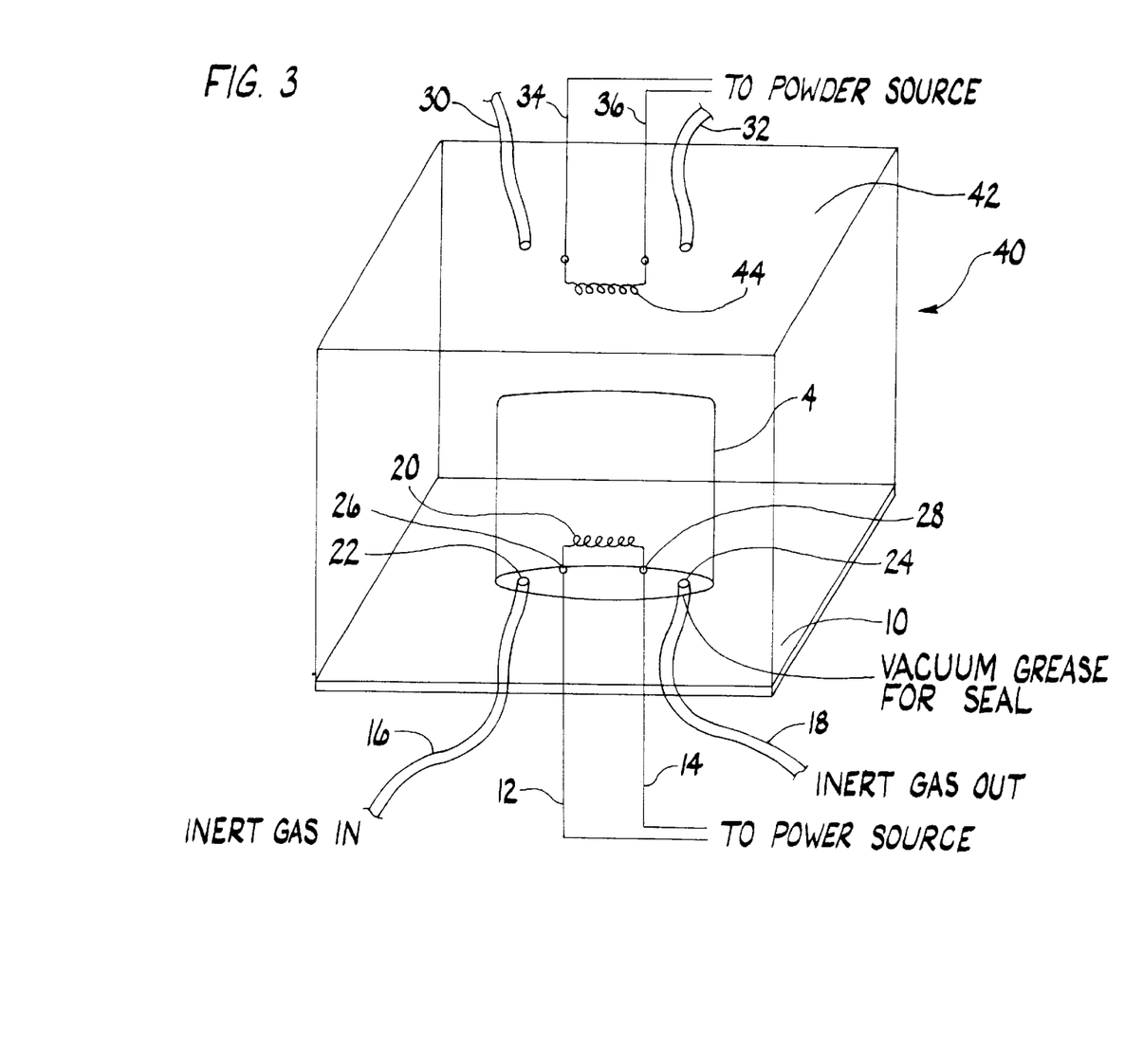
FIG. 3 is a diagram of an apparatus for annealing a tungsten dopant into the inside and/or outside surfaces of a crucible.

Referring now to FIG. 3, there is shown an apparatus 40 for annealing tungsten into the inside and/or the outside surfaces of a quartz crucible. In addition to the components illustrated in the apparatus for annealing tungsten into the inside surface of a quartz crucible shown in FIG. 1, the apparatus 40 comprises a vessel 42, a second tungsten element 44, a second inert gas inlet line 30, a second inert gas outlet line 32, and a second set of power leads 34 and 36 connected to a power supply (not shown.) The vessel 42 may be comprised of glass, stainless steel, or ceramic for example, and should mate closely to horizontal support surface 10 to ensure a tight seal to keep oxygen from entering the inert gas purged area. The second tungsten source 44 is similar to the tungsten source described above, and the inert gas inlet and outlet lines, 30 and 32 respectively, purge the vessel during annealing.

The inside and outside surfaces of a quartz crucible can be treated with the apparatus shown in FIG. 3 such that tungsten is annealed into both surfaces to create tungsten doped layers. The inside surface of the crucible is treated as described above such that tungsten source 20 is energized to anneal tungsten into the inside surface of the crucible to the desired depth. Tungsten source 44 is also energized to anneal tungsten into the outside surface of the crucible. The areas surrounding both tungsten sources are continuously purged with inert gas during the heating of the source to minimize the presence of oxygen and reduce the potential of source oxidation and the formation of solid oxides.

To anneal the tungsten into the outside surface of the crucible, the second tungsten source is energized and heated. The outside surface of the crucible is generally exposed to the vaporous tungsten for a period of between about 1 hour and about 10 hours, more preferably between about 2 hours and about 8 hours, still more preferably between about 4 hours and about 6 hours, and most preferably about 5 hours to create a tungsten doped layer containing no less that about 100 ppba tungsten, preferably no less than about 200 ppba tungsten, and most preferably no less than about 300 ppba tungsten into the outside surface of the crucible. The tungsten is diffused between about 0.1 millimeter and about 6 millimeters into the outside surface to create a tungsten doped layer on that surface having a depth equal to the depth of the diffused tungsten. The area containing the tungsten has 0 bubbles per cubic millimeter having a diameter at least about 15 micrometers.

It should be realized by one skilled in the art that the outside surface only of a crucible could be treated to create a crucible having tungsten annealed into the outside surface only. This creation of a tungsten doped layer on the outside surface only can be accomplished utilizing the apparatus set forth in FIG. 3 by simply energizing the second source for the desired time period. In this embodiment, only the outside surface is annealed as the tungsten source for treating the inside surface is not energized.

In an alternative embodiment of the present invention, prior to preparing the strontium doped polysilicon and charging the crucible, tungsten may be annealed into the inside surface, outside surface, or both the inside and outside surfaces of a quartz crucible through the use of a metallo-organic compound containing tungsten. In this embodiment, the metallo-organic compound is a solution of a tungsten compound in an organic solvent. The compound is applied to the inside surface, outside surface, or both the inside and the outside surfaces of the crucible to a thickness of between about 500 and about 2000 Angstroms, and allowed to dry. Subsequently, a layer of silica is applied to the treated crucible utilizing a silica gel, which dries to form a silica layer. Silica gel layering may be repeated to form several layers. The crucible is then annealed at a temperature of between about 550° C. and about 900° C. for a period of between about 1 and about 10 hours to interdiffuse the two layers such that the physical structure of the silica matrix is altered resulting in the collapse of bubbles due to the increased gas solubility as described above. During the annealing at least about 100 ppba of tungsten is diffused into the crucible surface and the organic components are vaporized.

In an alternative embodiment to the layering steps described above, intermixing of the silica and tungsten components using suitable precursor solutions such as tungsten isopropoxide and tetra ethyl orthosilicate may be used. The intermixed components are subsequently heated as described above to vaporize the organic components and anneal the tungsten to result in the desired physical effect after annealing. Additionally, arc fusing a mixture of tungsten and quartz sand such that the tungsten can remain in the silica matrix may be used in accordance with the present invention. Suitable tungsten sources for arc fusing may include oxides of tungsten.

In view of the above, it will be seen that the several objects of the invention are achieved. As various changes could be made in the above-described silicon doping process without departing from the scope of the invention, it is intended that all matter contained in the above description be interpreted as illustrative and not in a limiting sense.

What is claimed is:

1. A process for preparing a silicon melt in a silica crucible for growing a single silicon ingot, the process comprising:
    charging polysilicon to a crucible having a bottom wall and a sidewall formation, the bottom and sidewall formation having inside and outside surfaces;
    melting the polysilicon to form a mass of molten silicon in the crucible;
    doping the molten mass with strontium; and
    forming a layer of devitrified silica on the inside surface of the sidewall formation of the crucible which is in contact with the molten mass, the layer being nucleated by the strontium in the molten mass.

2. The process as set forth in claim 1 wherein the strontium dopant is selected from the group consisting of strontium nitrate, strontium chloride, strontium oxalate, strontium acetate, and strontium hydroxide.

3. The process as set forth in claim 1 wherein the strontium dopant is selected from the group consisting of strontium carbonate and strontium oxide.

4. The process as set forth in claim 1 wherein the dopant is in the form of an alloy of polysilicon and strontium.

5. The process as set forth in claim 1 wherein the inside surface of the sidewall formation but not the inside surface of the bottom of the crucible is devitrified.

6. The process as set forth in claim 1 wherein both the inside surface of the sidewall formation and the inside surface of the bottom of the crucible are devitrified.

7. The process as set forth in claim 1 wherein a concentration of at least about $1.5 \times 10^{-10}$ grams of strontium/volume of silicon charge ($cm^3$)/wetted area of silica ($cm^2$) is added.

8. The process as set forth in claim 1 wherein a concentration of at least about $6 \times 10^{-9}$ grams of strontium/volume of silicon charge ($cm^3$)/wetted area of silica ($cm^2$) is added.

9. The process as set forth in claim 1 wherein a concentration of at least about $3.5 \times 10^{-11}$ grams of strontium/volume of silicon charge ($cm^3$)/wetted area of silica ($cm^2$) is added.

10. The process as set forth in claim 1 wherein a concentration of at least about $2 \times 10^{-9}$ grams of strontium/volume of silicon charge ($cm^3$)/wetted area of silica ($cm^2$) is added.

11. The process as set forth in claim 1 further comprising coating the sidewall formation of the outside surface of the crucible with a devitrification promoter prior to the charging of the polysilicon.

12. The process as set forth in claim 1 wherein the crucible contains less than about 0.5% gases insoluble in silicon.

13. The process as set forth in claim 1 wherein the inside surface of the sidewall formation and the inside surface of the bottom of the crucible contains a tungsten doped layer prior to the introduction of the polysilicon and dopant.

14. The process as set forth in claim 13 further comprising tungsten doping the outside surface of the sidewall formation and the outside surface of the bottom of the crucible prior to the introduction of the polysilicon and dopant.

15. The process as set forth in claim 1 wherein the outside surface of the sidewall formation and the outside surface of the bottom of the crucible contain a tungsten doped layer prior to the introduction of the polysilicon and dopant.

16. A process for preparing a silicon melt in a silica crucible for growing a single silicon ingot, the process comprising:
    charging polysilicon to a crucible having a bottom and a sidewall formation, the bottom and sidewall formation having inside and outside surfaces;
    melting the polysilicon to form a mass of molten silicon in the crucible;
    doping the molten mass with strontium;
    forming a layer of devitrified silica on an inside surface of the sidewall formation of the crucible which is in contact with the molten mass, the layer being nucleated by the strontium in the molten mass; and
    charging additional dopant to the molten mass after the inside surface of the sidewall formation of the crucible is at least partially devitrified.

17. The process as set forth in claim 16 wherein the strontium dopant is selected from the group consisting of strontium nitrate, strontium chloride, strontium oxalate, strontium acetate, and strontium hydroxide.

18. The process as set forth in claim 16 wherein the strontium dopant is selected from the group consisting of strontium carbonate and strontium oxide.

19. The process as set forth in claim 16 wherein the dopant is in the form of an alloy of polysilicon and strontium.

20. The process as set forth in claim 16 wherein the inside surface of the sidewall formation but not the inside surface of the bottom of the crucible is devitrified.

21. The process as set forth in claim 16 wherein both the inside surface of the sidewall formation and the inside surface of the bottom of the crucible are devitrified.

22. The process as set forth in claim 16 wherein a concentration of at least about $1.5 \times 10^{-10}$ grams of strontium/volume of silicon charge ($cm^3$)/wetted area of silica ($cm^2$) is added.

23. The process as set forth in claim 16 wherein a concentration of at least about $6 \times 10^{-9}$ grams of strontium/volume of silicon charge ($cm^3$)/wetted area of silica ($Cm^2$) is added.

24. The process as set forth in claim 16 wherein a concentration of at least about $3.5 \times 10^{-11}$ grams of strontium/volume of silicon charge ($cm^3$)/wetted area of silica ($cm^2$) is added.

25. The process as set forth in claim 16 wherein a concentration of at least about $2 \times 10^{-9}$ grams of strontium/volume of silicon charge ($cm^3$)/wetted area of silica ($cm^2$) is added.

26. The process as set forth in claim 16 further comprising coating the outside surface of the sidewall formation of the crucible with a devitrification promoter prior to the charging of the polysilicon.

27. The process as set forth in claim 16 wherein the crucible contains less than about 0.5% gases insoluble in silicon.

28. The process as set forth in claim 16 wherein the inside surface of the sidewall formation and the inside surface of the bottom of the crucible contain a tungsten doped layer prior to the introduction of the polysilicon and dopant.

29. The process as set forth in claim 28 further comprising tungsten doping the outside surface of the sidewall formation and outside surface of the bottom of the crucible prior to the introduction of the polysilicon and dopant.

30. The process as set forth in claim 16 wherein the outside surface of the sidewall formation and the outside surface of the bottom of the crucible contain a tungsten doped layer prior to the introduction of the polysilicon and dopant.

31. A process for preparing a silicon melt in a silica crucible for growing a single silicon ingot, the process comprising:

charging polysilicon to a crucible having a bottom wall and a sidewall formation, the bottom wall and sidewall formation having inside and outside surfaces;

melting the polysilicon to form a mass of molten silicon in the crucible;

doping the molten mass with strontium; and forming a layer of devitrified silica on the inside surface of the crucible which is in contact with the molten mass, the layer being nucleated by the strontium in the molten mass.

32. The process as set forth in claim 31 wherein the strontium dopant is selected from the group consisting of strontium nitrate, strontium chloride, strontium oxalate, strontium acetate, and strontium hydroxide.

33. The process as set forth in claim 31 wherein the strontium dopant is selected from the group consisting of strontium carbonate and strontium oxide.

34. The process as set forth in claim 31 wherein the dopant is in the form of an alloy of polysilicon and strontium.

35. A process for preparing a silicon melt in a silica crucible for growing a single silicon ingot, the process comprising:

charging polysilicon and strontium to a crucible having a bottom wall and a sidewall formation, the bottom and sidewall formation having inside and outside surfaces;

melting the polysilicon to form a mass of molten silicon in the crucible; and forming a layer of devitrified silica on the inside surface of the sidewall formation of the crucible which is in contact with the molten mass, the layer being nucleated by the strontium in the molten mass.

36. The process as set forth in claim 35 wherein the strontium dopant is selected from the group consisting of strontium nitrate, strontium chloride, strontium oxalate, strontium acetate, and strontium hydroxide.

37. The process as set forth in claim 35 wherein the strontium dopant is selected from the group consisting of strontium carbonate and strontium oxide.

* * * * *

UNITED STATES PATENT AND TRADEMARK OFFICE
CERTIFICATE OF CORRECTION

PATENT NO. : 6,350,312 B1
DATED : February 26, 2002
INVENTOR(S) : Richard Joseph Phillips et al.

It is certified that error appears in the above-identified patent and that said Letters Patent is hereby corrected as shown below:

Title page,
Item [75], Inventors, should read -- Richard Joseph Phillips, St. Peters; Steven Jack Keltner, O'Fallon; John Davis Holder, Lake St. Louis, all of MO (US); Larry E. Drafall, Cleveland, OH (US) --.

Column 13,
Line 23, "silica ($Cm^2$)" should read -- silica ($cm^2$) --.

Signed and Sealed this

Twenty-third Day of December, 2003

JAMES E. ROGAN
*Director of the United States Patent and Trademark Office*